United States Patent
McClure

[11] Patent Number: 5,831,457
[45] Date of Patent: Nov. 3, 1998

[54] INPUT BUFFER CIRCUIT IMMUNE TO COMMON MODE POWER SUPPLY FLUCTUATIONS

[75] Inventor: David Charles McClure, Carrollton, Tex.

[73] Assignee: STMicroelectronics, Inc., Carrollton, Tex.

[21] Appl. No.: 477,283

[22] Filed: Jun. 7, 1995

Related U.S. Application Data

[63] Continuation of Ser. No. 240,091, May 9, 1994, abandoned, which is a continuation of Ser. No. 970,266, Nov. 2, 1992, abandoned.

[51] Int. Cl.$^6$ .................................................. H03B 1/00
[52] U.S. Cl. ........................... 327/108; 327/109; 327/379
[58] Field of Search ............................... 307/246, 272.2, 307/272.3, 530, 542, 543, 556, 260, 265, 412, 443, 464, 451, 475, 491, 493; 328/165, 164; 327/51, 58, 100, 108–112, 379, 142, 172, 309, 310, 311, 334, 362, 365, 564

[56] References Cited

U.S. PATENT DOCUMENTS

| | | | |
|---|---|---|---|
| 4,176,289 | 11/1979 | Leach | 307/246 |
| 4,210,829 | 7/1980 | Wong et al. | 307/272.3 |
| 4,477,736 | 10/1984 | Onishi | 307/297 |
| 4,754,170 | 6/1988 | Toda et al. | 307/443 |
| 4,783,603 | 11/1988 | Goforth et al. | 307/443 |
| 4,886,986 | 12/1989 | Watanabe | 307/542 |
| 4,921,445 | 5/1990 | Yazdy | 307/443 |
| 5,017,803 | 5/1991 | Yoshida | 307/571 |
| 5,041,741 | 8/1991 | Steele | 307/443 |
| 5,041,889 | 8/1991 | Kriedt et al. | 357/23.13 |
| 5,103,115 | 4/1992 | Ueda et al. | 307/272.3 |
| 5,148,391 | 9/1992 | Zagar | 365/96 |
| 5,329,174 | 7/1994 | Chiang | 307/443 |

FOREIGN PATENT DOCUMENTS

| | | |
|---|---|---|
| 544 224A2 | 11/1992 | European Pat. Off. . |
| 2284515 | 11/1990 | Japan . |

*Primary Examiner*—Terry Cunningham
*Assistant Examiner*—Jeffrey Zweizig
*Attorney, Agent, or Firm*—Theodore E. Galanthay; Kenneth C. Hill; Lisa K. Jorgenson

[57] ABSTRACT

The present invention provides an input buffer circuit for reducing false transitions within a circuit. The input buffer circuit includes an input pad for receiving an input voltage, an input buffer having an input and a circuit for modifying a voltage entering the input buffer to track changes in a power supply voltage relative to a voltage at the input pad. The circuit is connected in series between the input pad and the input the input buffer.

4 Claims, 1 Drawing Sheet

INPUT BUFFER CIRCUIT IMMUNE TO COMMON MODE POWER SUPPLY FLUCTUATIONS

This is a continuation of application Ser. No. 08/240,091, filed May 9, 1994, abandoned which is a continuation of application Ser. No. 07/970,266, filed Nov. 2, 1992 abandoned.

BACKGROUND OF THE INVENTION

1. Field of the Invention

The present invention relates generally to the field of integrated circuits and in particular to a circuit for reducing the effects of noise in an integrated chip. Still more particularly, the present invention is directed towards a circuit for reducing false transitions in an input buffer on an integrated chip.

2. Description of the Prior Art

Inductance and current transients can cause significant power supply bounce within circuits on an integrated chip. Simulations of integrated circuits have demonstrated that positive supply voltages, Vcc, are strongly coupled to ground voltages, Vss. Simulations also demonstrate that these voltages tend to remain in phase with each other. The magnitude of the Vcc and Vss bounce, although coupled to each other, can be quite extreme. Although this type of noise is typically undesirable, circuitry within an integrated circuit can function as long as the difference between Vcc and Vss remains relatively constant. Such functioning is possible since both Vcc and Vss remain more or less in phase with each other.

On the other hand, problems may occur at the inputs to an integrated circuit. The input voltages presented to the integrated circuit may be voltages that are independent from the supply voltage noise within the integrated circuit. The fluctuations of the input voltages may not match those of the power supply voltages. Consequently, the integrated chip may function improperly.

FIG. 1 depicts a graph of signals resulting from the above described conditions. Basically, FIG. 1 illustrates false transitions in the output, Vout, of an input buffer due to fluctuations between supply voltages, Vcc and Vss, and an input voltage, Vin, that do not track each other. The magnitude of power supply voltages, Vcc and Vss, that power the input buffer both fluctuate, or bounce, in a similar manner. As a result the difference between Vcc and Vss remains fairly constant. Vin is the signal entering an input buffer from the input pad and is equivalent to a logic high. Normally, when Vin is a logic high, Vout, the signal out of the input buffer, is low. Vin, as illustrated in FIG. 1, however, does not fluctuate or bounce in a manner that tracks Vcc and Vss. As a result, the difference between Vin and Vss changes as may be seen from FIG. 1.

As can be seen, the differences between Vin and Vss may lessen to about delta 2, delta 4, and delta 6. These differences between Vin and Vss cause the input buffer, which may be an inverter, to interpret Vin as a logic low. In turn, Vout transitions to a high signal until the difference between Vin and Vss becomes great enough to cause the input buffer to interpret the signal as a high logic signal and output a low signal. Vin in actuality also would fluctuate due to noise from a source separate from the supply voltages. A constant Vin is depicted in order to clearly illustrate the problem of false transitions. In addition, Vout does not change as sharply during false transitions as illustrated in FIG. 1. In actuality, Vout would show a gradual transition.

These false transitions are undesirable since they may be interpreted as data changes, causing incorrect chip operations. As a result, it would be desirable to have a circuit system to compensate for supply bounce to reduce occurrences of false transactions.

SUMMARY OF THE INVENTION

The present invention is an input buffer circuit for reducing false transitions within a circuit. The input buffer circuit includes an input pad for receiving an input voltage, an input buffer, and a circuit for modifying a voltage entering the input buffer to track changes in a power supply voltage relative to a voltage at the input pad. The circuit is connected in series between the input pad and the input buffer.

The circuit may be an RC network including a resistor having one end connected to the input pad and the other end connected to the input of the input buffer. The RC network also includes a capacitor having one end connected to the second end of the resistor and the other end connected to a power supply in accordance with a preferred embodiment of the present invention.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The present invention provides an input buffer circuit that causes the input signal into the input buffer to more or less track the bounce of supply voltages, Vcc and Vss, to avoid false transitions within the integrated circuit. In other words, the present invention provides a circuit to cause or force the input signal into the input buffer to fluctuate in a manner that more closely tracks the supply voltage fluctuations. The circuit of the present invention achieves this result by providing a decoupling mechanism between the input signal and the input buffer and a coupling mechanism between the input buffer and Vss or Vcc.

Figure 2:
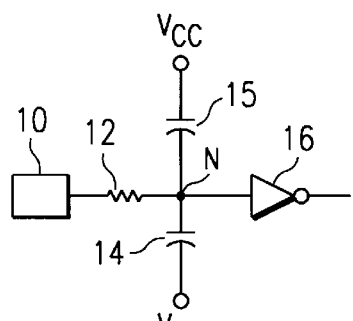
FIG. 2 is a schematic diagram of an input buffer circuit for prevent false transitions within an integrated circuit in accordance with a preferred embodiment of the present invention.

FIG. 2 is a schematic diagram of an input buffer circuit for reducing false transitions within an integrated circuit. Input pad 10 is connected to one end of resistor 12, while the other end of resistor 12 is connected to node N. Capacitor 14 is also connected to node N. The other end of capacitor 14 is connected to the ground supply voltage, Vss, in accordance with a preferred embodiment of the present invention. Depending on the application capacitor 14 may be connected to some other supply voltage. The input of input buffer 16 also is connected to node N. In accordance with a preferred embodiment of the present invention, input buffer 16 is an inverter.

Resistor 12 should be placed as close as possible to the input gate of input buffer 16 to maximize the ratio of capacitor 14 to the parasitic capacitance at node N in accordance with a preferred embodiment of the present invention. Such a placement of resistor 12 will provide for optimal coupling efficiency and minimize RC delay. As resistor 12 is placed farther away from the input gate of input buffer 16 and closer to input pad 10, the parasitic capacitance from the line forming the connection to buffer 16 increases. In such a situation, the value of capacitor 14 must be increased to optimize coupling between the power supply voltage and the input of input buffer 16, which results in increases in RC delay because of increased capacitance at node N since capacitor 14 and parasitic capacitance has been increased.

Resistance used for electrostatic discharge (ESD) in a input pad is insufficient for decoupling the voltage at the input pad in accordance with a preferred embodiment of the present invention for the reasons stated above.

Resistor 12 provides the decoupling mechanism between the input buffer and Vss, while capacitor 14 provides a coupling mechanism between input buffer 16 and Vss in accordance with a preferred embodiment of the present invention. Without resistor 12, the voltage at node N would not significantly fluctuate with Vss because of the relatively large capacitance at input pad 10. A second capacitor, such as capacitor 15, may have one end attached to node N and a second end connected to power supply voltage Vcc.

In accordance with a preferred embodiment of the present invention, an n-channel capacitor is employed for capacitor 14. An n-channel capacitor is employed since ground bounce, the bouncing of Vss, affecting VIH levels is a typical problem. A p-channel capacitor connected to Vcc instead of Vss may be used if fluctuations or bounce in Vcc is a concern. Furthermore, both an n-channel capacitor and a p-channel capacitor may be employed to reduce effects from Vcc and Vss in accordance with a preferred embodiment of the present invention. Such a configuration, however, may increase the RC delay of the circuit for normal input transitions. Although the depicted embodiment shows a p-channel or n-channel capacitor, those skilled in the art will realize that any type of capacitor may be employed in accordance with a preferred embodiment of the present invention.

Figure 3:
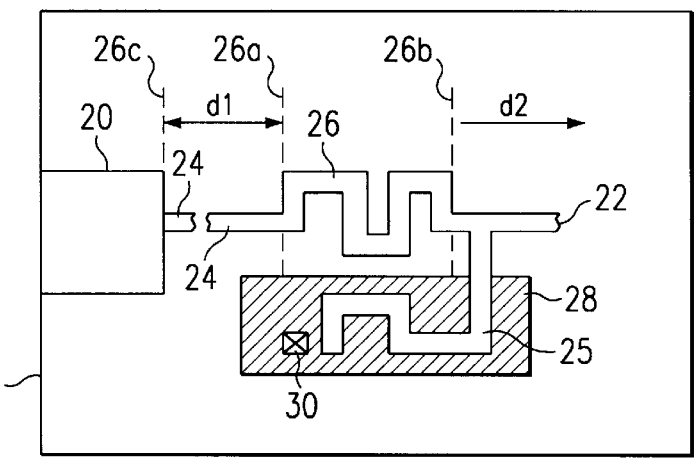
FIG. 3 is a diagram of a layout for an input buffer circuit of the present invention.
Figure 4:
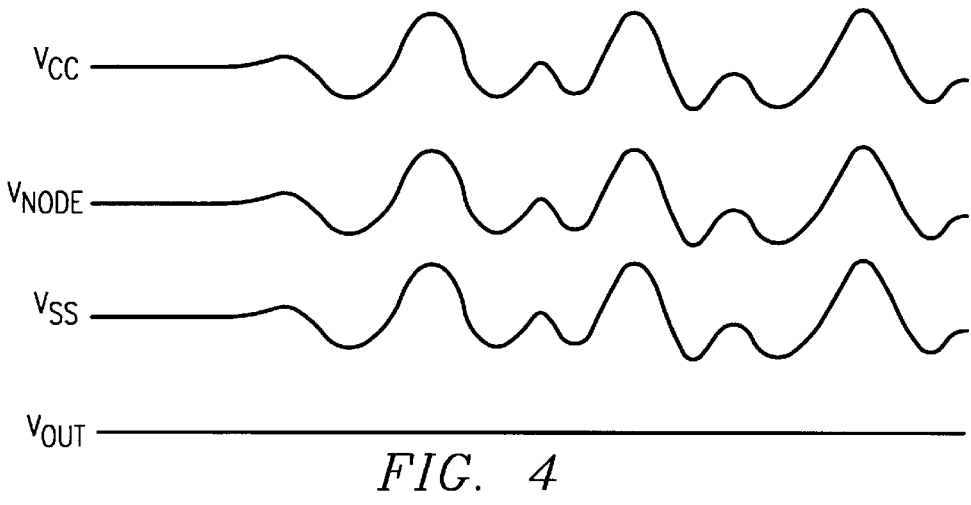
FIG. 4 is a graph of signals illustrating the lack of false transitions during the operation of an input buffer circuit of the present invention.

Next, FIG. 3 depicts a layout for the schematic diagram of the input buffer circuit of FIG. 4. Input pad 20 lies on the field oxide 18 and is connected to an input buffer (not shown) at point 22. The connection is achieved utilizing metal line 24. The resistor is located between lines 26a and 26b, and is formed using known techniques. For example, poly could be used for the resistor on line 26 between lines 26a and 26b or the resistor may be formed by suitably masking the region between lines 26a and 26b during dopant implant or silicidation of line 26. Distance d1 between line 26a and line 26c is the distance between the resistor and input pad 20. Distance d2 is the distance between the resistor and the input buffer. Distance d1 is greater than distance d2.

The capacitor is formed over n-diffusion 28 with a section of poly line 25. A contact 30 to n-diffusion 28 connects to a Vss line (not shown) grounding one terminal of the capacitor. The capacitor is basically a field effect transistor with the drain and the source connected to each other. The layout depicted in FIG. 3 is for illustrative purposes and is not drawn to scale. Those of ordinary skill in the art will realize that other layouts, may be utilized to construct an input buffer circuit of the present invention.

Figure 1:
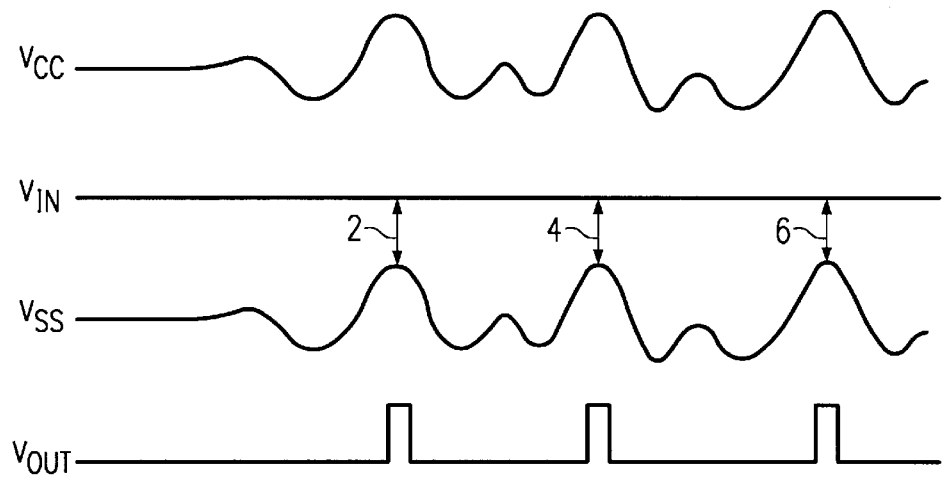
FIG. 1 is a graph of signals illustrating false transitions in the output of an input buffer due to fluctuations between supply voltages and an input voltage that do not track each other.

Turning now to FIG. 4, a graph is depicted of signals illustrating the operation of an input buffer circuit constructed in accordance with a preferred embodiment of the present invention. This graph results from an input buffer circuit constructed with the schematic diagram depicted in FIG. 2. In this graph, Vcc and Vss fluctuate or bounce in roughly the same manner as illustrated in FIG. 1. Vnode is the voltage at node N, and fluctuates in a manner closely tracking the fluctuations in Vcc and Vss. Vnode also is the voltage sent into the input buffer. Consequently the input voltage into the input buffer also fluctuates in a manner closely tracking the fluctuations of Vcc and Vss. As a result, false transitions are not seen in Vout, the output voltage of the input buffer. The present invention is not intended to adjust the voltage at the input pad, but at node N.

Consequently, immunity to noise from the supply voltages is increased utilizing an input buffer circuit in accordance with a preferred embodiment of the present invention. Although the depicted embodiment employs an input buffer, the present invention may be applied to other types of buffers by those skilled in the art.

Another advantage of the present invention is that the input buffer circuit may be operated with the outputs switching faster since noise immunity is increased. Prior to the present invention, some circuits were speed limited because of switching (bounce) effects. With the present invention, this problem may be partially ignored. Consequently, a faster device with the same input levels as a device without the input buffer circuit may be constructed.

The present invention may be implemented in all integrated circuits that are sensitive to input levels or supply voltage noise. Such integrated circuits include, for example, memories such as DRAMs, SRAMs, PROMs; logic chips such as microprocessors; application specific integrated circuits; and many other devices. The present invention may be utilized in commodity devices or high speed devices to improve speed and/or input level margins.

An added advantage of present invention is that the input buffer circuit requires very little layout area on an integrated chip.

While the invention has been particularly shown and described with reference to a preferred embodiment, it will be understood by those skilled in the art that various changes in form and detail may be made therein without departing from the spirit and scope of the invention.

What is claimed is:

1. An input buffer circuit connected to a circuit on an integrated chip for reducing false transitions within the circuit, the input buffer circuit comprising:

an input pad for receiving a signal from a source outside the integrated chip;

a resistor having a first end connected to the input pad and a second end connected to a node, the resistor located closer to the node than to the input pad;

a first capacitor having first end connected to a power supply ground terminal and a second end connected to the node;

a second capacitor having a first end connected to a power supply positive terminal and a second end connected to the node; and an inverter connected to the power supply and having an input connected to the node, wherein a voltage of the signal entering the input buffer tracks changes in the power supply voltage relative to the voltage of the signal at the input pad to reduce false transitions within the circuit.

2. The input buffer circuit of claim 1, wherein the first capacitor is an n-channel capacitor.

3. The input buffer circuit of claim 1, wherein the second capacitor is a p-channel capacitor.

4. The buffer of claim 1, wherein the resistor is formed in parallel with the first capacitor.

* * * * *